United States Patent [19]

de Jonge et al.

[11] Patent Number: 4,471,467
[45] Date of Patent: Sep. 11, 1984

[54] MAGNETIC DOMAIN DEVICE

[75] Inventors: Frederik A. de Jonge; Antonius G. H. Verhulst, both of Eindhoven, Netherlands

[73] Assignee: U.S. Philips Corporation, New York, N.Y.

[21] Appl. No.: 18,197

[22] Filed: Mar. 6, 1979

Related U.S. Application Data

[63] Continuation of Ser. No. 810,100, Jun. 27, 1977, abandoned.

[30] Foreign Application Priority Data

Jul. 20, 1976 [NL] Netherlands .......................... 7608002

[51] Int. Cl.³ ............................................. G11C 19/08
[52] U.S. Cl. .......................................... 365/8; 365/32
[58] Field of Search ................................ 365/8, 43, 32

[56] References Cited

U.S. PATENT DOCUMENTS 3,689,901 9/1972 Bobeck ..................................... 365/8
4,086,661 4/1978 Matsuyama et al. ................. 365/43

OTHER PUBLICATIONS

AIP Conference on Magnetism & Magnetic Materials, Dec. 3-6, 1974, pp. 556-557 and pp. 645-646.
IBM Technical Disclosure Bulletin, vol. 18, No. 12, May 1976, p. 4204.

Primary Examiner—James W. Moffitt
Attorney, Agent, or Firm—Marc D. Schechter

[57] ABSTRACT

A magnetic device comprising at least one thin layer of a magnetizable material which has an easy axis of magnetization approximately normal to the surface of the layer. Magnetic domains are propagated in the layer by a rotating magnetic field in co-operation with a pattern of magnetizable material on the layer. Domains are detected by passing a current through a pattern of magneto-resistive material on the layer. At least in the part of the device where the detection occurs, the propagation and detection patterns have substantially the same configuration and one pattern is situated between the layer of magnetizable material and the other pattern.

7 Claims, 9 Drawing Figures

MAGNETIC DOMAIN DEVICE

This is a continuation of Ser. No. 810,000, filed June 27, 1977, now abandoned.

BACKGROUND OF THE INVENTION

The invention relates to a magnetic device comprising at least one thin layer of a magnetizable material which has an easy axis of magnetization which is substantially normal to the surface of the layer. A propagation pattern of magnetizable material and a detection pattern of magnetoresistive material are provided on said layer. An external magnetic field may be provided as means for propagating magnetic domains in the layer in conjunction with the propagation pattern, and electrical circuitry may be provided as means for detecting magnetic domains in conjunction with the detection pattern.

In such a device which is known from AIP Conference Proceedings No. 24 Magnetism and Magnetic Materials 1974 pages 556–557, the configuration of the pattern of magnetizable material is such that the magnetic domains propagate in response to a rotating magnetic field in the layer. For that purpose the configuration satisfies that of a propagation element for magnetic domains. The configuration of the pattern of magnetoresistive material is such that the detection of the magnetic domains is realized in cooperation with the means for detecting magnetic domains. For that purpose the configuration satisfies that of a detection element for magnetic domains, which means, inter alia that this pattern should be capable of conducting current in connection with the magnetoresistive detection. The two patterns are substantially co-planar and are separated from the layer of magnetizable material by a layer of SiO$_2$.

In manufacturing the device, two patterns are provided one after the other by means of mask technology. This means that in providing the second pattern the associated mask has to be aligned very accurately with respect to the first pattern. In the article it is stated that this technique has only limited application as the bubble domain sizes decrease toward 1 μm, because of these alignment problems.

SUMMARY OF THE INVENTION

It is an advantage of the invention that this size restriction does not occur in the device according to the invention. In addition, domains having a diameter smaller than 1 μm may be used. For that purpose the patterns have substantially the same configuration at least in the part of the device where the detection of the magnetic domains occurs, one pattern being situated between the layer of magnetizable material and the other pattern. In addition to advantages to be mentioned hereinafter, the use of substantially identical configurations of the patterns enables the manufacture of the patterns by means of one mask.

In the part of the device where the detection of the magnetic domains occurs, the configuration of the patterns is that of a current-conducting pattern because this is necessary for the pattern of magnetoresistive material in connection with the detection. Of course, the requirement that the configuration is also that of a propagation pattern still remains. With reference to the mutual electrical conductivity of the patterns the following remarks apply. In the case of two patterns which are connected together throughout their surface in an electrically conductive manner, the detection is not adversely influenced when the parallel resistance of the two patterns does not differ too much from the resistance of the magnetoresistive pattern. The parallel resistance of the two patterns in the area where the detection occurs is preferably not less than one-tenth the resistance of the pattern of magnetoresistive material alone. This can be realized by appropriately choosing the resistances of the two patterns or by separating the two patterns from each other by an at least partly electrically insulating, substantially non-magnetic material.

In the part of the device where no detection of the magnetic domains occur, it is possible for the two patterns to have the same configuration, namely that of a propagation element. Since the pattern of magnetoresistive material does not fulfil a function in this part, it is also possible to have no pattern of magnetoresistive material here.

In particular, the detection pattern, of magnetoresistive material, is situated between the magnetic domain layer, of magnetizable material, and the propagation pattern, of magnetizable material. This means that the pattern of material by means of which the magnetic domains are detected is situated between the layer of magnetizable material in which the magnetic domains are present, and the pattern of magnetizable material by means of which the magnetic domains are propagated. In this case the detection pattern is closer to the magnetic domains, which is favorable for detection.

The fact that the configuration of the patterns is substantially the same presents the further possibility of compensating for the stray field which originates from the measuring current through the detection pattern and which acts on the magnetic domains. For that purpose, the pattern of magnetizable material is electrically conductive. During detection, a current which is opposite to that in the detection pattern is passed through the propagation pattern in the part of the device where detection takes place. By properly choosing the value of the current through the propagation pattern it is possible to compensate for the stray field so that no stray field acts on the magnetic domains. The value of the current through the propagation pattern depends on the measuring current through the detection pattern and on the mutual position of the propagation pattern and the detection pattern relative to the magnetizable layer.

The measuring current through the detection pattern not only gives rise to a stray field which acts on the magnetic domains but also to a stray field which acts on the propagation pattern and in this manner influences the propagation of the magnetic domains. This can be mitigated if between the pattern of magnetoresistive material and the pattern of magnetizable material a condition pattern of electrically conductive substantially non-magnetic material of substantially the same configuration is present which is separated from the pattern of magnetoresistive material by a pattern of at least partly electrically insulating, substantially non-magnetic material. Upon detection, a current which flows opposite to that in the detection pattern is passed through the pattern of electrically conductive, substantially non-magnetic material. By properly choosing the value of the current through the pattern of electrically conductive material it is possible to compensate for the stray field so that substantially no stray field or acts on the magnetic domains, while the stray field originating from the measuring current through the detection pattern and acting on the propagation pattern is compensated for at least partly.

When in the part of the device where the detection takes place the detection pattern is connected electrically at one end to the propagation pattern of magnetizable electrically conductive material or to the conductive pattern of electrically conductive non-magnetic material, no separate current for the compensation of the stray fields is necessary. In such a case the same current in one pattern flows opposite to that in the other pattern, as a result of which in one case substantially no stray field acts on the magnetic domains and in the other case on the magnetic domains and the propagation pattern. In particular, in one case the pattern of magnetoresistive material and the pattern of magnetizable material, in the part of the device where the detection takes place, are connected electrically at one end. In the other case the pattern of magnetoresistive material and the pattern of electrically conductive, substantially non-magnetic material are connected electrically at one end.

There are several manners of manufacturing the device. In all cases first a thin layer of a magnetizable material is provided on a non-magnetic substrate body. This is the layer in which the magnetic domains will become situated. In a first case said layer of magnetizable material is provided with a soluble lacquer by means of one mask in those areas where the patterns of magnetizable material and of magnetoresistive material should not be present. On the layer of magnetizable material provided locally with lacquer a layer of magnetizable material and a layer of magnetoresistive material are then provided in the desired sequence, and possibly a layer of at least partly electrically insulating, substantially non-magnetic material is provided between these two layers. The lacquer is finally dissolved as a result of which the undesired parts of the layers, provided on the domain layer, present at said areas are removed.

In a second case, there are provided on the layer of magnetizable material a layer of magnetizable material and a layer of magnetoresistive material in the desired sequence and, possibly a layer of at least partly electrically insulating, substantially non-magnetic material is provided between said two layers. The assembly is then provided with a soluble lacquer by means of one mask in those parts where the patterns of magnetizable material and of magnetoresistive material should become situated. The undesired parts of the layers which are not covered with lacquer are removed by sputter-etching and the lacquer is finally dissolved.

It is to be noted that a magnetic device is known from IEEE Transactions on Magnetics Vol., MAG-9, No. 3, September 1973, pp. 474–480, in which the domain layer of magnetizable material is provided with a single pattern of magneto-resistive material, which pattern functions as both the propagation pattern and the detection pattern. Although this device is advantageous in that the pattern is manufactured by means of one mask, this advantage is possible only by compromising as regards the thickness of the pattern and the properties of the material, since the one pattern must satisfy both requirements regarding propagation and regarding detection.

This invention will now be described in greater detail, by way of example, with reference to the accompanying drawing.

DESCRIPTION OF THE PREFERRED EMBODIMENTS

Figure 1:
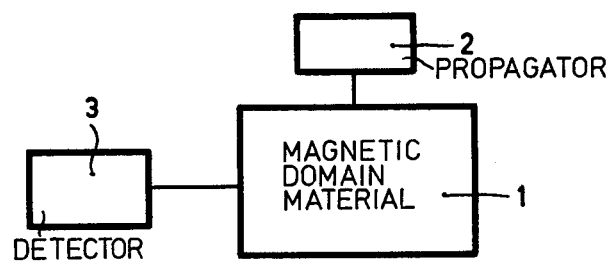
FIG. 1 is a diagrammatic representation of a magnetic domain device.

FIG. 1 is a diagrammatic representation of a device according to the invention of which block 1 represents at least a thin layer of magnetizable material in which magnetic domains can be produced, 2 comprise means for propagating magnetic domains in the layer, and 3 comprises means for detecting magnetic domains.

Figure 2:
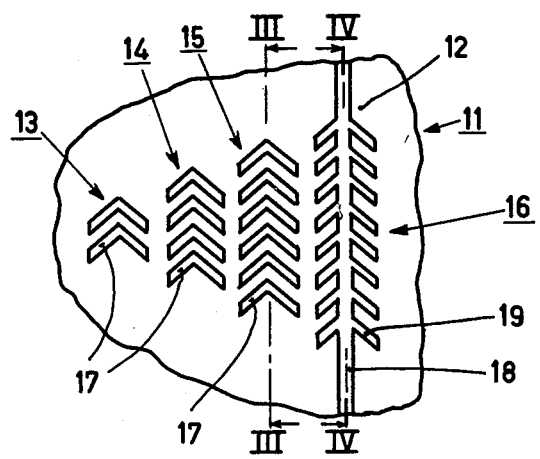
FIG. 2 is a plan view of a part of a device according to the present invention.

FIG. 2 is a plan view of a portion 11 of block 1, namely a portion in which magnetic domains are propagated and detected. Visible in FIG. 2 are a magnetizable layer 12, and patterns 13, 14, 15 and 16 the upper layer of which consists of magnetizable material. The patterns 13, 14, and 15 comprise so-called chevrons 17. The pattern 16 comprises an assembly of a strip 18 and chevrons 19 which thus are connected together. The configuration of the pattern 16 is that of a propagation pattern because chevrons 19 are present, and is that of a current conductive pattern as a result of the strip 18.

Figure 3:
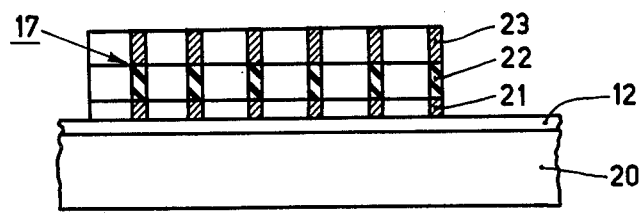
FIG. 3 is a sectional view taken on the line III—III of FIG. 2.

FIG. 3 is a diagrammatic sectional view taken on the line III—III of FIG. 2. The magnetizable layer 12 is situated on a substrate 20 and has an easy axis of magnetization which is approximately normal to the surface of the layer. The pattern 15 comprising the chevrons 17 is constructed from a lower layer 21 of magnetoresistive material, a middle layer 22 of electrically insulating non-magnetic material, and an upper layer 23 of magnetizable material which is also shown in FIG. 2.

Figure 4:
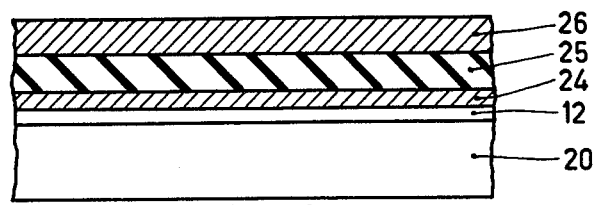
FIG. 4 is a sectional view taken on the line IV—IV of FIG. 2.

FIG. 4 is a diagrammatic sectional view taken on the line IV—IV of FIG. 2. The magnetizable layer 12 is situated on the substrate 20. The pattern 16 comprising the strip 18 and the chevrons 19 is constructed from a lower part layer 24 of magnetoresistive material, a middle layer 25 of electrically insulating non-magnetic material, and an upper layer 26 of magnetizable material which is also shown in FIG. 2. The ends of the lower layer 24 of the strip 18 are connected, outside the device shown in FIG. 2, to a current source which is included in the detecting means 3.

Under the influence of a magnetic field rotating in the plane of the layer 12 and generated by the propagating means 2, which field cooperates with the upper part of the chevrons, magnetic domains are propagated from the pattern 13 to the pattern 14, then to the pattern 15 and then to the pattern 16. The magnetic domains are detected in the pattern 16 by means of a current which is supplied by the detecting means 3 and which flows through the lower layer 24 of the strip 18.

Figure 5:
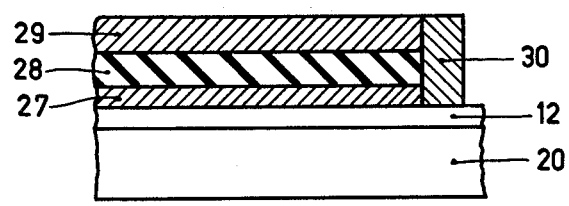
FIG. 5 shows a sectional view, analogous to FIG. 4, of a device with a different construction as compared to FIG. 4.

FIG. 5 is a diagrammatic sectional view of the construction of the pattern 16 which differs from that shown in FIG. 4. The magnetizable layer 12 is situated on the substrate 20. The pattern 16 comprising the strip 18 and the chevrons 19 is constructed from a lower layer 27 of magnetoresistive material, a middle layer 28 of electrically insulating, non-magnetic material, and an upper layer 29 of magnetizable material which in this case is also electrically conductive. At one end of the strip 18 the layers 27 and 29 are connected by means of electrically conductive material 30. In this case the other ends (not shown) of the layers 27 and 29 of the strip 18 are connected to a current source which is included in the detecting means 3. The advantage of this configuration is that substantially no stray field originating from the measuring current used during the detection acts on the magnetic domains. The additional advantage of this configuration is that the two current connections are situated on one side of the pattern 16 so that a current connection to the other side which might cross the propagation path of the domains may be omitted.

Figure 6A:
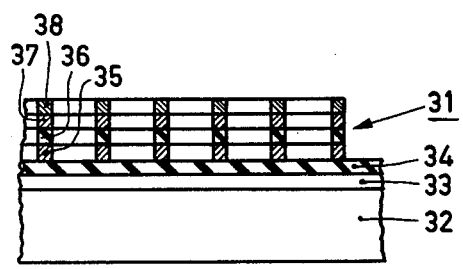
FIGS. 6a and 6b show sectional views, analogous to those in FIGS. 3 and 4 respectively, of a device with a seven layer construction.

FIG. 6a is a diagrammatic sectional view showing chevrons 31 which are constructed differently from those shown in FIG. 3. A magnetizable layer 33 which has an easy axis of magnetization approximately normal to the surface of the layer is present on a substrate 32. Present on said layer is a spacer layer 34. The chevrons 31 are constructed from a lower layer 35 of magnetoresistive material, a layer 36 present thereon of electrically insulating, non-magnetic material, a layer 37 of electrically conductive, non-magnetic material, and a layer 38 of magnetizable material.

Figure 6B:
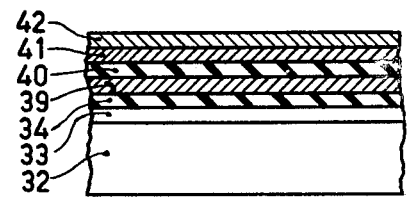

FIG. 6b is a diagrammatic sectional view of the device with strip and chevrons which corresponds to the chevrons 31 of FIG. 6a and which, of course, has a different construction from that shown in FIG. 4. Disposed on the substrate 32 is the magnetizable layer 33 on which the spacer layer 34 is situated. The strip and chevrons are constructed from a lower layer 39 of magnetoresistive material, a layer 40 disposed thereon of electrically insulating non-magnetic material, a layer 41 of electrically conductive non-magnetic material and a layer 42 of magnetizable material. The ends of the lower layer 39 of the strip are connected to a current source not shown. The ends of the layer 41 of the strip are also connected to a current source, not shown. The magnetic domains are detected by means of a measuring current which flows through the lower layer 39 of the strip. The stray field which is generated by said measuring current and which acts on the magnetic domains in the layer 33 and on the propagation layer 42, is compensated for by an oppositely directed current which flows through the layer 41 of the strip.

In a given case the substrate 32 consists of gadolinium-gallium-garnet and the magnetizable layer 33 thickness 5 $\mu$m, consists of $Sm_{0.3}Y_{2.7}Ga_{1.2}Fe_{3.8}O_{12}$. The spacer layer 33 has a thickness of 4000 Å and consists of $SiO_x$, where x is approximately 2. The layers 35 and 39 have a thickness of 400 Å and consist of nickel-iron with 80 atom % Ni and 20 atom % Fe. The layers 36 and 40 have a thickness of 4000 Å, and consists of $SiO_x$, where x is approximately 2. The layers 37 and 41 have a thickness of 2000 Å and consist of aluminium. The layers 38 and 42 have a thickness of 4000 Å and consist of nickel-iron with 80 atom % Ni and 20 atom % Fe.

Figure 7A:
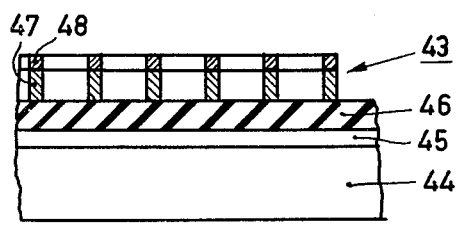
FIGS. 7a and 7b show sectional views analogous to those of FIGS. 3 and 4 respectively, of a device with a different construction.

FIG. 7a is a diagrammatic sectional view with chevrons 40 which are constructed differently from those shown in FIGS. 3 and 6a. Present on a substrate 44 is a magnetizable layer 45 which has an easy axis of magnetization approximately normal to the surface of the layer. A spacer layer 46 is present on said layer. The chevrons 43 are constructed from a lower layer 47 of magnetizable material and an upper layer 48 of magnetoresistive material. The spacer layer 46 serves to create the space between the magnetizable layer 45 and the pattern 47 of magnetizable material, which space is necessary for the ready operation of the device.

Figure 7B:
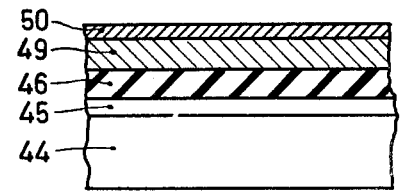

FIG. 7b is a diagrammatic sectional view of the device with strip and chevrons which corresponds to the chevrons of FIG. 7a and which, of course, has a different construction from that shown in FIGS. 4 and 6b. Present on the substrate 44 is magnetizable layer 45 and thereon the spacer layer 46. The strip and chevrons are constructed from a lower layer 49 of magnetizable material and an upper layer 50 of magnetoresistive material. The ends of the upper layer 50 of the strip are connected to a current source, not shown. If the composition of the magnetizable material of the lower layer 49 is such that the layers 49 and 50 are electrically conductively connected to each other throughout their surfaces, then the layers are constructed, for example, by choosing their compositions such that the parallel resistance of the layers 49 and 50 between the connections of the current source is not less than one-tenth the resistance of the layer 50 between said connections, alone.

What is claimed is:

1. A magnetic device comprising:
   at least one thin magnetic domain layer of a magnetizable material which has an easy axis of magnetization substantially normal to the surface of the layer;
   a propagation pattern of magnetizable material; and
   a detection pattern of magnetoresistive material;
   wherein, at least in the area of the device where the detection of the magnetic domains occurs, the propagation pattern and the detection pattern have substantially the same configuration, one pattern being disposed on the magnetic domain layer between the magnetic domain layer and the other pattern, and the propagation pattern and the detection pattern are substantially aligned, one directly above the other, along the domain layer's easy axis of magnetization.

2. A magnetic device as claimed in claim 1, wherein the parallel resistance of the two patterns in the area where the detection occurs is at least one-tenth the resistance of the pattern of magnetoresistive material.

3. A magnetic device as claimed in claim 1, wherein the two patterns are separated by an at least partly electrically insulating, substantially non-magnetic material.

4. A magnetic device as claimed in claim 3, wherein the propagation pattern of magnetizable material is electrically conductive.

5. A magnetic device comprising:
   at least one thin magnetic domain layer of a magnetizable material which has an easy axis of magnetization substantially normal to the surface of the layer;
   a propagation pattern of magnetizale material;
   a detection pattern of magnetoresistive material;
   a pattern of at least partly electrically insulating, substantially nonmagnetic material; and
   a conductive pattern of electrically conductive, substantially nonmagnetic material;
   wherein all of the patterns are stacked on the magnetic domain layer and, at least in the area of the device where detection of the magnetic domains occurs, all of the patterns have the same configuration, the conductive pattern being disposed between the detection pattern and the propagation pattern, the insulating pattern being disposed between the conductive pattern and the detection pattern, and all of the patterns are substantially aligned along the domain layer's easy axis of magnetization.

6. A magnetic device as claimed in claim 5, wherein the pattern of magnetoresistive material and the pattern of electrically conductive, substantially nonmagnetic material in the area of the device where the detection occurs are connected electrically at one end.

7. A magnetic device comprising:

at least one thin magnetic domain layer of a magnetizable material which has an easy axis of magnetization substantially normal to the surface of the layer;

a propagation pattern on electrically conductive, magnetizable material;

a detecion pattern of magnetoresistive material; and a pattern of at least partly electrically insulating, substantially nonmagnetic material;

wherein all of the patterns are stacked on the magnetic domain layer and, at least in the area of the device where detection of the magnetic domains occurs, all of the patterns have the same configuration and the propagation and detection patterns are electrically connected at one end, the insulating pattern being disposed between the propagation pattern and the detection pattern, and all of the patterns are substantially aligned along the domain layer's easy axis of magnetization.

* * * * *

UNITED STATES PATENT AND TRADEMARK OFFICE
CERTIFICATE OF CORRECTION

PATENT NO. : 4,471,467
DATED : September 11, 1984
INVENTOR(S) : FREDERIK A. de JONGE ET AL It is certified that error appears in the above-identified patent and that said Letters Patent is hereby corrected as shown below:

In the title page:

(30) Foreign Application Priority Data

"7608002" should be --7608003--.

In the claims:

Claim 7, line 5,
"on" should be --of--.

Signed and Sealed this

Nineteenth Day of February 1985

[SEAL]

Attest:

DONALD J. QUIGG

Attesting Officer     Acting Commissioner of Patents and Trademarks